United States Patent
Bailey et al.

(10) Patent No.: US 8,514,374 B2
(45) Date of Patent: Aug. 20, 2013

(54) ALIGNMENT METHOD FOR SEMICONDUCTOR PROCESSING

(75) Inventors: Todd C. Bailey, Hopewell Junction, NY (US); William Chu, Hopewell Junction, NY (US); William Muth, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 12/611,947

(22) Filed: Nov. 4, 2009

(65) Prior Publication Data
US 2011/0102760 A1 May 5, 2011

(51) Int. Cl.
- *G01B 11/00* (2006.01)
- *G03B 27/32* (2006.01)
- *G03B 27/42* (2006.01)

(52) U.S. Cl.
USPC ................... 355/77; 355/53; 356/399

(58) Field of Classification Search
USPC ............... 250/492.2; 355/53, 55, 67, 72, 77; 356/399–401, 615–624; 700/121
See application file for complete search history.

(56) References Cited

U.S. PATENT DOCUMENTS

| | | | |
|---|---|---|---|
| 4,052,603 A | 10/1977 | Karlson | |
| 4,198,159 A | 4/1980 | Cachon | |
| 5,042,709 A | 8/1991 | Cina et al. | |
| 6,237,393 B1 | 5/2001 | Ames et al. | |
| 6,921,615 B2 | 7/2005 | Sreenivasan et al. | |
| 6,950,188 B2 | 9/2005 | Wu et al. | |
| 7,186,483 B2 | 3/2007 | Sreenivasan et al. | |
| 7,333,173 B2 | 2/2008 | Chiang et al. | |
| 2004/0083021 A1* | 4/2004 | Somekh et al. | 700/121 |
| 2007/0239305 A1* | 10/2007 | Zhuang et al. | 700/108 |
| 2010/0028790 A1* | 2/2010 | Seltmann et al. | 430/30 |
| 2010/0305737 A1* | 12/2010 | Good et al. | 700/105 |

* cited by examiner

*Primary Examiner* — Hung Henry Nguyen
*Assistant Examiner* — Colin Kreutzer
(74) *Attorney, Agent, or Firm* — Howard M. Cohn; Ian D. MacKinnon (57) ABSTRACT

A method provides improved alignment for a photolithographic exposure. In such method, a first exposure tool and a first chuck used in a reference photolithographic exposure of a first material layer on a substrate can be identified. The substrate typically includes at least a semiconductor layer. The first chuck typically is one of a plurality of chucks usable with the first exposure tool. The method may further include identifying a second exposure tool and a second chuck used in a current photolithographic exposure of a second material layer on the substrate. In one embodiment, alignment correction information specific to each of the identified first exposure tool, the first chuck, the second exposure tool and the second chuck can be used in aligning the semiconductor substrate to a second exposure tool and a second chuck. In one embodiment, such method can compensate for alignment error caused by differences between the first and second exposure tools, between the first and second chucks, or between the first and second exposure tools and between the first and second chucks.

4 Claims, 4 Drawing Sheets

ALIGNMENT METHOD FOR SEMICONDUCTOR PROCESSING

BACKGROUND OF THE INVENTION

1. Field of the Invention

The subject matter of the present application relates to semiconductor processing and more specifically to a method for providing improved alignment for making a photolithographic exposure.

2. Description of the Related Art

Photolithography refers to a process of transferring geometric shapes on a photomask or reticle ("mask") to a semiconductor wafer or layer on the wafer. Typically, a photolithography exposure tool is used to cast an image of the mask shapes onto a photoresist layer on the wafer, and then, once the imaged photoresist layer is developed, the resulting photoresist patterns can be transferred to another layer of the wafer, such as by etching. During processing, a wafer can undergo a photolithography step to form patterns in one layer of the wafer, and then undergo a subsequent photolithography step to form patterns in another layer of the wafer above the earlier patterns. Sometimes, both the first and subsequent photolithography steps can be performed using the same photolithography exposure tool. More commonly, however, different photolithography exposure tools are used. The use of different exposure tools presents challenges because each tool can cause distortion and misalignment of the exposure image with the patterns formed on the wafer by an earlier used tool. Moreover, as each exposure tool can have more than one chuck to hold the wafer in the exposure tool, alignment error can occur in a way that is unique to each chuck.

SUMMARY OF THE INVENTION

Accordingly, a method herein provides improved alignment for a photolithographic exposure. In such method, a first exposure tool and a first chuck used in a reference photolithographic exposure of a first material layer on a substrate can be identified. The substrate typically includes a semiconductor layer. The first chuck typically is one of a plurality of chucks usable with the first exposure tool. The method can further include identifying a second exposure tool and a second chuck used in a current photolithographic exposure of a second material layer on the substrate. In one embodiment, alignment correction information specific to each of the identified first exposure tool, the first chuck, the second exposure tool and the second chuck can be used in aligning the semiconductor substrate to a second exposure tool and a second chuck. In one embodiment, such method can compensate for alignment error caused by differences between the first and second exposure tools, between the first and second chucks, or between the first and second exposure tools and between the first and second chucks.

In another embodiment, a computer-readable medium can be provided which has instructions recorded thereon which are executable by a processor to perform a method such as described above. In yet another embodiment, a system is provided which includes a processor and instructions, wherein the instructions are executable by a processor to perform a method such as described above.

DETAILED DESCRIPTION

An embodiment herein can provide improved alignment for making a photolithographic exposure. Heretofore, variation between pieces of equipment used in earlier and later photolithography steps has not been fully addressed. Systems have not fully compensated for alignment error that is unique to each chuck on photolithography exposure tools having multiple chucks. Systems have not compensated for alignment error introduced by a difference between the specific chuck of a tool used to make the current photolithographic exposure and the specific chuck of another tool used to make a prior photolithographic exposure.

Figure 1:
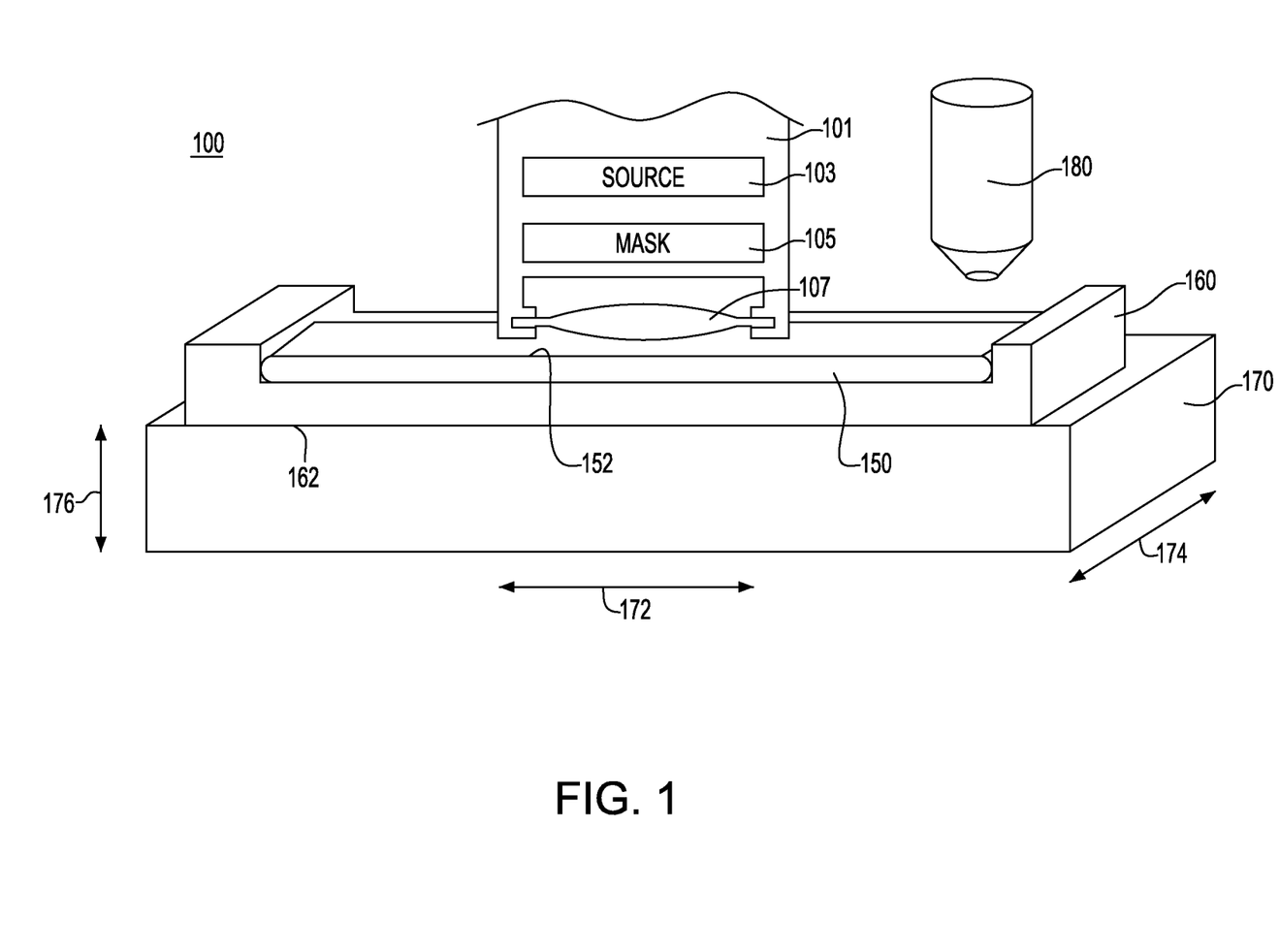
FIG. 1 is a sectional view illustrating a photolithographic system according to an embodiment herein.

As seen in FIG. 1, a photolithography exposure tool 101 of a photolithography exposure system 100 contains an optical path from an illumination source 103 through a photomask 105 or reticle ("mask") and optics 107, e.g., a series of optical elements, e.g., lenses, collimators and refractive or diffractive elements. The optics 107 focus an image of the shapes on the mask onto a photoimageable layer at a major surface 152 of a substrate such as the wafer 150. A chuck 160 firmly holding the wafer allows the wafer to be moved with the chuck precisely into position on the exposure tool. Once the wafer is properly aligned with the exposure tool, the image cast by the tool on the wafer will be aligned with patterns of the wafer that were formed previously.

Many exposure tools today can use more than one chuck for efficiency. One chuck firmly holds a first wafer while the first wafer is moved onto the exposure tool, aligned therewith and then processed, i.e., exposed by the tool. While the first wafer is being aligned and processed, a second chuck allows a second wafer to be loaded thereon. Typically, after processing the first wafer, a robotic arm (not shown) of the tool may move the first chuck and the first wafer thereon away from the processing position. The robotic arm can then move the second chuck into position on the exposure tool, the second chuck now holding the second wafer thereon. The second wafer then is aligned with the exposure tool and the tool forms an exposure on the second wafer. Then, simultaneously while the second wafer is being aligned with the tool and processed, robotic equipment of the tool can unload the first wafer from the first chuck and load a third wafer onto the first chuck.

Alignment error in photolithography exposure tools typically varies from one exposure tool to another exposure tool and from one chuck to another chuck. The effect that an individual exposure tool makes upon distortion and alignment of the patterns in a photoresist layer can be referred to as that tool's "fingerprint". As discussed above, while systems heretofore have corrected for differences between one exposure tool and another (the different tool fingerprints), they have not corrected for the different chuck fingerprints. Often, this did not pose a problem when the alignment was not critical. However, some photolithography steps require critical alignment, i.e., alignment to critical dimensions on the wafer. For steps requiring critical alignment, some systems restrict use of the tool to a single chuck. When a single chuck is used, the chuck's fingerprint can be characterized as a component of the exposure tool. In this way, exposures can be made which fully account for the chuck's effect upon alignment. However, this way of addressing tool-to-tool alignment can severely limit wafer throughput on the exposure tool. With only one chuck in use, the system can only have one wafer loaded on the tool at a time. When the system is processing a first wafer on the chuck, the system cannot begin loading a second wafer onto the chuck until it completely finishes processing and unloads the first wafer from the chuck.

In another case, a photolithographic exposure system attempts to compensate for differences between the current and prior exposure tools in a way that is not specific to one chuck or another. In such case, the specific fingerprints of each chuck on the prior exposure tool are averaged and used together with the fingerprint of the prior tool as the prior reference. The prior reference in such system fails to precisely account for the effect of either of the chucks of the prior exposure tool.

In view of the foregoing described operation and in improvement thereof, a system and a method herein corrects for distortion and misalignment caused by tool-to-tool and chuck-to-chuck differences, even when the current photolithography exposure tool utilizes multiple chucks and a prior exposure tool utilizes multiple chucks. Referring again to FIG. 1, the purpose of the exposure tool 101 is to cast an image of the shapes of the mask 105 onto a photoimageable layer (not shown) at the wafer surface 152. In one example, the photoimageable layer can be a photoresist layer, also referred to as a "resist" layer. The resist layer will be subsequently developed and conditioned (e.g., by drying or baking) into a patterned resist layer having "resist patterns". The resist patterns include lines that can have the same or different widths and can have the same or different lengths. The lines of the resist patterns can be separated from each other by spaces having the same or different widths and lengths. The spaces of the resist patterns define areas to be subjected to a subsequent process, such as a subsequent etch process or a subsequent ion implantation process. The lines of the resist patterns define areas that are protected from the subsequent process. In this way, the resist patterns can be used in a subsequent process to etch desired patterns into an underlying layer of the wafer, such as, for example, a semiconductor layer or an oxide layer.

To expose the resist layer and form resist patterns correctly aligned with underlying patterns created previously in the wafer, the wafer surface 152 must be correctly aligned with the tool 101 when the exposure tool exposes the resist layer to form the resist patterns. The chuck 160 can have a surface 162 in contact with a translation stage 170, and the translation stage can be clamped to the chuck. To align the wafer surface 152, the translation stage 170 can precisely move the chuck with the wafer held thereon in directions 172, 174 parallel to a plane defined by the wafer surface 152. The translation stage typically can also be moved in vertical directions 176 relative to the exposure tool 101. The directions 172, 174 can be straight and may or may not be orthogonal to each other. Typically, directions 176 are orthogonal to the plane defined by the wafer surface 152. The translation stage 170 may provide for straight linear movement in orthogonal directions (e.g., directions 172, 174) as well as in directions of rotation.

Figure 2:
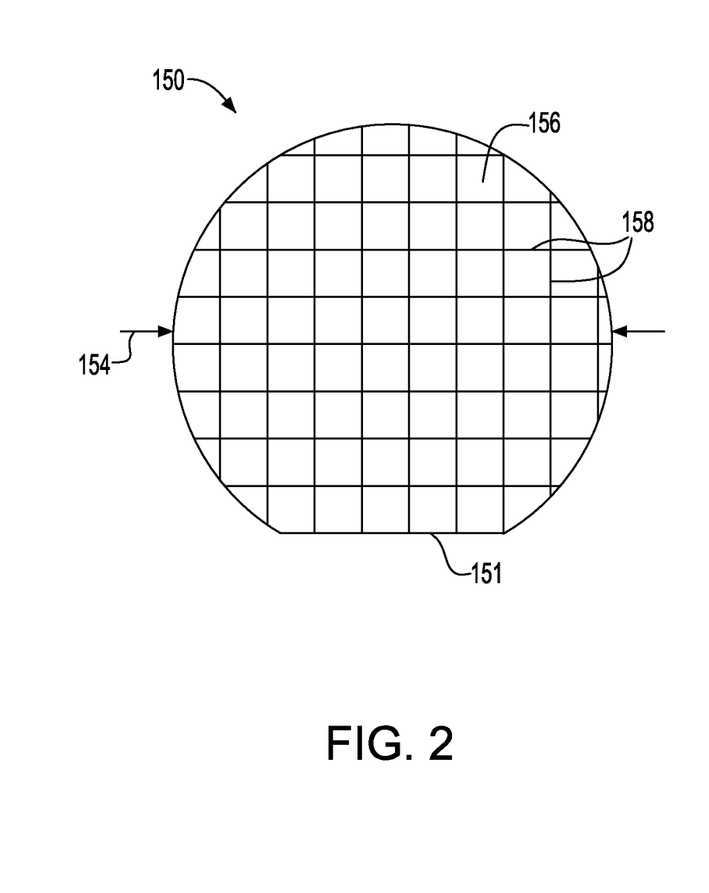
FIG. 2 is a plan view illustrating a wafer for processing in accordance with an embodiment herein.

Referring to FIG. 2, a wafer 150 typically is a large flat disc-like substrate which includes at least a layer of monocrystalline semiconductor material. The substrate may consist essentially of semiconductor material. The wafer generally is a circular disc, but may have one "flat", i.e., a straight edge 151, which can be used as a reference surface to align the wafer with a chuck or other fixture. Alternatively, instead of a flat, the wafer can have an edge which is circular all around except for one or more small notches in the edge which can be used as reference points to align the wafer with a chuck or fixture. For its part, the chuck can have surfaces which cooperate with the flat or the notched wafer edge to precisely locate the wafer thereon. With the aid of the flat or notched wafer edge and the cooperating chuck surfaces, once a wafer has been loaded to a chuck, the locations of features on the wafer can be known, at least coarsely, by the location of the wafer on the chuck. Aligning the wafer to the exposure tool then involve aligning the chuck with the exposure tool. A subsequent process can finely align the wafer to the tool by measuring the position of the wafer more precisely on the chuck, and further correcting the position of the chuck based on the more precise measurements.

The wafer has a diameter 154 in accordance with a tool designed to process the wafer. Wafers processed on recently made tools often have a diameter 154 of 200 millimeters (mm) or 300 millimeters. Each wafer typically contains a multiplicity of individual semiconductor regions 156 having the same shape and size which are joined together in a grid pattern on the wafer defined by dicing lanes 158 which run in different directions along the surface of the wafer 150. When processing of the wafer finishes, a saw can sever the wafer along the dicing lanes 158 into individual semiconductor chips.

As further seen in FIG. 1, a measurement tool 180 typically is not part of the exposure tool and typically is used at a time that is different from when the exposure tool is being used to expose the resist layer on the wafer surface 152. The measurement tool, which can include an imaging device, can determine a degree to which later formed patterns on the wafer surface 152 are aligned with earlier formed patterns, such as in a layer of the wafer which underlies the later formed patterns. The measurement tool typically is used with a wafer after the exposed resist layer has been developed and cured (e.g., by heating) to form developed resist patterns. In one embodiment, the measurement tool determines how well the developed resist patterns are aligned with patterns in an earlier formed layer of the wafer. For example, the measurement tool can locate certain indicia, such as alignment marks (not shown), in the earlier formed wafer patterns and can compare their positions with other indicia, e.g., other alignment marks (not shown) in the later formed resist patterns.

Figure 3:
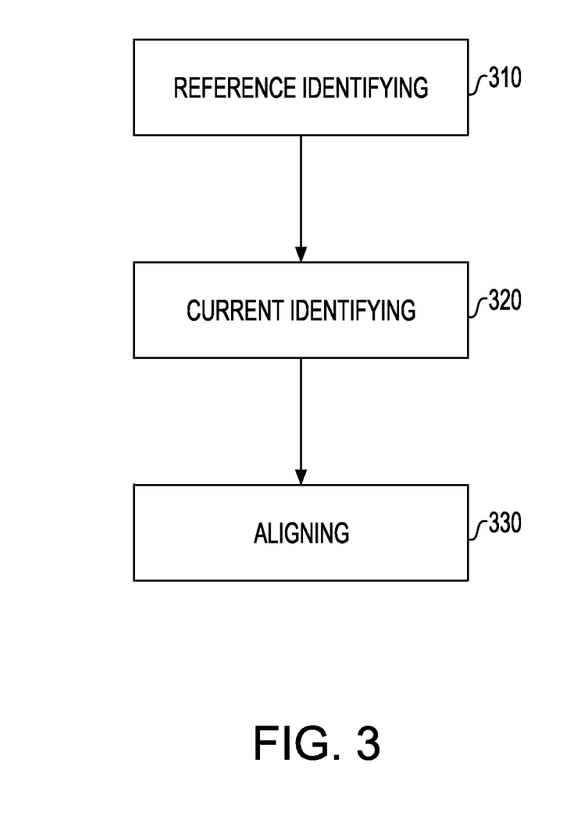
FIG. 3 is a flow chart illustrating an improved alignment method in accordance with an embodiment herein.

A method of providing improved alignment for a photolithographic exposure can proceed in accordance with the actions seen in FIG. 3. As seen therein, one action to be performed in accordance with such method is reference identifying (310). This step relates to identifying a first exposure tool and a first chuck used in a reference photolithographic exposure of a material layer on a substrate such as a semiconductor wafer. Identification can be done automatically, such as through a data collection system which tracks the processing of each wafer such as by recording identification data by a processor, by sensing signals from optically verifiable bar codes or by receiving radio-wave signals from radio frequency identification (RFID) tags.

The first chuck typically is one of at least two chucks usable with the first exposure tool, such that this step identifies which of the at least two chucks was used. The material layer can be a previously patterned material layer of the wafer. The reference exposure typically refers to an exposure conducted on an exposure tool prior to the exposure that is currently being made. Typically, data identifying the exposure tool and the chuck is captured when a wafer is loaded onto the chuck of an exposure tool to be exposed. This data can then be recalled at a later time to identify the exposure tool data and chuck used to make the reference exposure.

In another step, a second exposure tool and a second chuck used in a current photolithographic exposure are identified (320). The second exposure tool and second chuck are used to make an exposure of a second material layer on the substrate, e.g., the wafer. The second chuck typically is also one of at least two chucks usable with the first exposure tool, such that this step identifies which of the at least two chucks was used. The second exposure tool and second chuck typically are each different from the first exposure tool and first chuck. However, this may not be so in all cases. The second material layer refers to a material layer that is patterned subsequently to the first material layer. Typically, the second material layer lies above the first material layer, but this may not be so in all cases.

With the exposure tools and chucks used thereon identified, alignment correction information that is specific to each of the identified first exposure tool, the first chuck, as well as the second exposure tool and the second chuck can then be recalled and used. The alignment correction information typically includes a fingerprint of the first exposure tool and a fingerprint of the first chuck. In addition, the information can include a fingerprint of the second exposure tool and a fingerprint of the second chuck. As discussed above, a fingerprint can characterize an effect of such tool or chuck on the alignment of the wafer with respect to ideal alignment. Then, using the fingerprints of currently used exposure tool and the prior exposure tool, as well as the fingerprints of the currently used chuck and prior chuck, the substrate or wafer can be aligned on the second chuck with respect to the current exposure tool (330). That is, alignment correction information can be provided to an automatic process control (APC) system (not shown) to control movement of the translation stage 170 (FIG. 1) or the exposure tool 101 relative to the other. In such way, the alignment of the exposure tool with respect to the wafer can be altered to a position that is more correct. In this way, compensation can be made for alignment error that occurs between the first and second exposure tools and the first and second chucks. Specifically, compensation can be made for the effect of each of the chucks used on the current and prior exposure tools on alignment, as well as the effect of the current and prior exposure tools themselves.

In one embodiment, this information can include alignment correction information that is specific to the maintenance cycle state. For example, the identification of the first chuck can include an identification of the maintenance cycle state of the first chuck, i.e., an identification of which of a series of maintenance cycles has been performed on the first chuck. Because the chuck's effect on alignment can change with the maintenance performed on it and the chuck's effect on alignment can be characterized upon completion of the maintenance cycle, identifying the maintenance cycle allows reference to data which correctly characterizes the chuck for the particular maintenance cycle it has undergone. The alignment correction information in such case is specific to the particular maintenance cycle state of the chuck as was used in the prior exposure.

In a particular example, the alignment correction information can be specific to the maintenance cycle state of the chuck, and it can also include information derived from measuring the alignment of patterns created using the first exposure tool and the first chuck in a material layer of at least one substrate.

In further process, alignment correction information specific to the first exposure tool and the first chuck may be obtained by process including measuring alignment of patterns that are created using the first exposure tool and the first chuck in a material layer of at least one second substrate. For example, after developing resist patterns after an exposure using the first tool 101 and first chuck 160, a measurement tool, e.g., tool 180, can be used to measure the alignment of such resist patterns relative to an ideal reference. The information obtained by such measurement tool can then be used to provide alignment correction information that is specific to the first exposure tool and information specific to the particular one of at least two chucks used thereon. That information will then be used in the aligning step to correct the alignment of the wafer with respect to the exposure tool. This measurement need not be done for each wafer being exposed by the exposure tool 101. In one example, the alignment correction information is obtained by performing measurements on at least two different semiconductor substrates or wafers.

As discussed above, the second material layer that is exposed by the second exposure tool can be one that overlies a previously patterned material layer, such as an oxide or semiconductor layer of the wafer. The method may further include obtaining the alignment correction information that is specific to the second exposure tool and the second chuck by process including measuring an alignment of patterns created by the second exposure tool in a second material layer of at least one second substrate.

In addition, in a particular embodiment, a processor-enabled system, e.g., a computer-controlled system, the alignment correction information that is specific to one or more of the first or second exposure tools or the first or second chucks. In this way, the system can determine whether one or more of the first or second exposure tools or the first or second chucks has changed. When that is the case, and if so, the system can re-obtain alignment correction information specific to one or more of the first or second exposure tools, specific to the first or second chucks, or specific to the first and second exposure tools and the first and second chucks.

Among benefits which may be possible using the above-described method (FIG. 3) are the following. Scaling of chip designs often requires aggressive layer to layer alignment. The system can provide better wafer to tool alignment because the fingerprints of the previous tool and the particular chuck thereon, as well as the fingerprints of the current tool and the particular chuck thereon are considered when aligning the wafer into position on the current exposure tool. Because the system takes into account the particular chuck used on the previous tool, patterns can be formed using the previous tool with multiple chucks thereon, such that there is no need to limit use of the previous tool to a single chuck. As a result, wafer throughput is not restricted by using a single chuck. As discussed above, a multiple chuck exposure system allows for simultaneous alignment and exposure of one wafer on a first chuck while another wafer can be queued up, loaded onto a second chuck, and be ready for processing as soon as the first chuck with first wafer is removed from the exposure tool.

Figure 4:
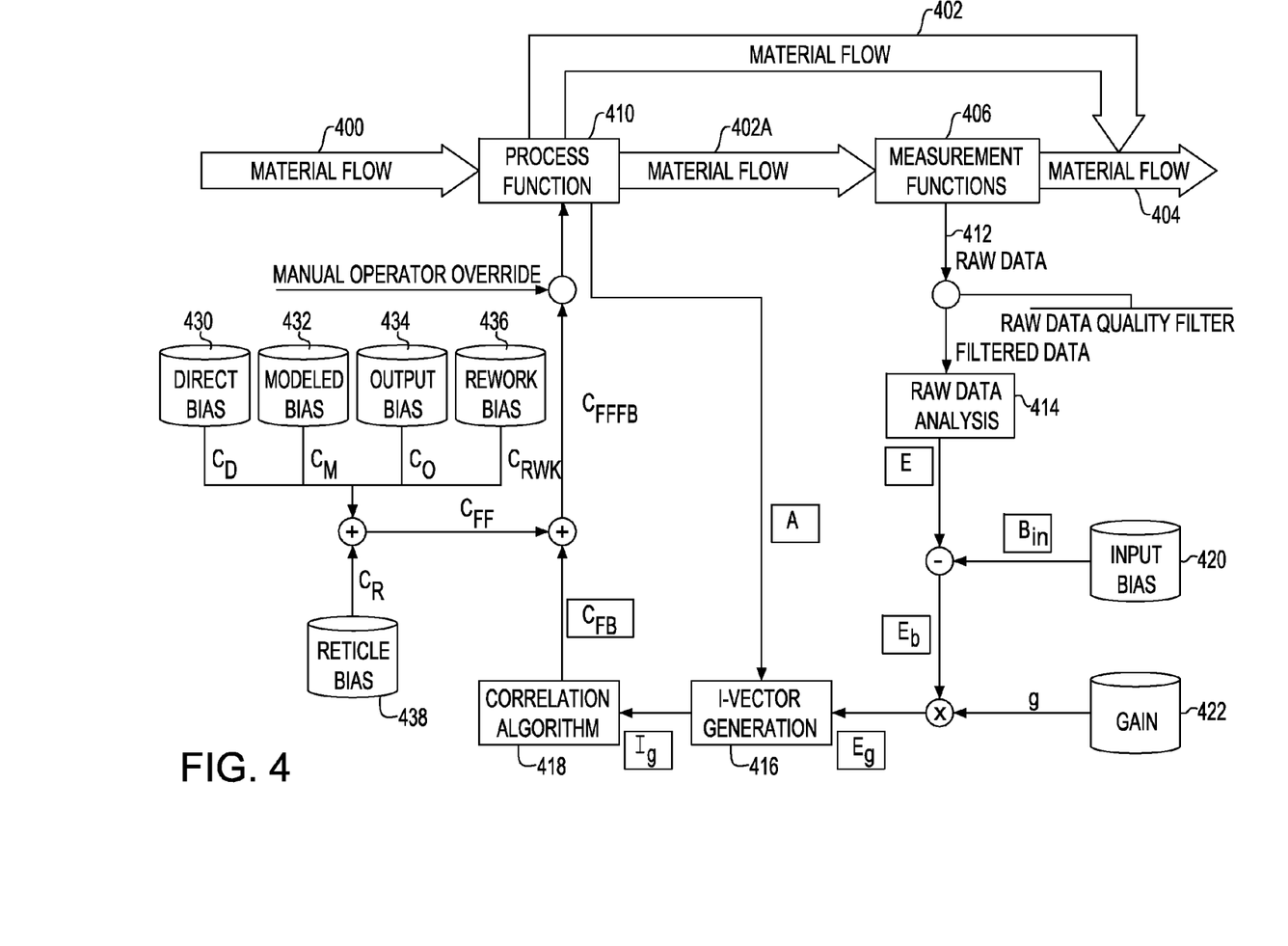
FIG. 4 is a flowchart illustrating an adaptive method in accordance with an embodiment herein.

FIG. 4 is a schematic diagram further illustrating a method in accordance with an embodiment of the invention. A material flow 400 refers to a flow of wafers from prior processing which are input to a process function 410 to expose and develop a photoresist layer of the wafer as described above (FIGS. 1-3). The schematic diagram (FIG. 4) illustrates an adaptive mechanism for improving the photolithographic exposure of wafers. The adaptive mechanism includes flow of feedback and feed forward data relating to the results of processing and conditions affecting processing. In this way, a computer can control processing of the wafers to alter process conditions and improve results based on analysis of results.

During processing of wafers, variable data from a variety of sources are utilized to align the exposure tool to the wafer surface to produce an exposure on the photoresist layer in correct alignment with preexisting patterns thereon. The variable data can include sources of bias caused by optical elements in the exposure tool including Direct Bias 430, Modeled Bias 432, Output Bias 434 and Rework Bias 436, as well as Reticle Bias 438 resulting from the "reticle" (mask) 105 (FIG. 1) used in the exposure tool. Signals CD, CM, CO, CRWK, and CR from these sources of bias, respectively, can be combined or processed to form a correlation feed forward (CFF) input. Some of these inputs can be fingerprints of the prior exposure tool and the particular chuck used on the prior exposure tool. The CFF input can be combined with other inputs to adapt the process function 410 to changes in conditions which affect the exposure. For example, the CFF input can be combined with a correlation feedback (CFB) input to produce a CFFFB (correlation feed forward feedback) input. The CFFFB input can be combined with manual input in form of "Manual Operator Override", if any, and be provided as input for adjusting the process function 410.

As further seen in FIG. 4, after being handled via process function 410, most wafers continues being handled via material flow 402 and subsequent processing (not shown) represented by material flow 404. However, some wafers are diverted from the regular material flow 402 and into material flow 402A instead, where the wafers are input to measurement functions 406. Typically, the measurement functions performed on wafers are non-destructive such that the wafers in material flow 402A are returned to a main material flow 404 after measurement. The measurement functions utilize one or more measurement tools such as the measurement tool 180 described above with reference to FIG. 1, to produce data which can be used to determine the location of resist patterns produced by the process function 410 using the current exposure tool. The measurement function outputs Raw Data 412 which can be processed by a "Raw Data Quality Filter" and then be provided to a Raw Data Analysis function 414. In one example, that function 414 can compare the location of resist patterns produced by the process function 410 on the current wafer with the location of patterns of an earlier processed layer of the wafer. In this way, the function 414 can determine the degree of alignment of resist patterns produced by the current tool relative to the earlier produced patterns. The product of Raw Data Analysis 414 can be an error signal (E) which represents the difference between ideal alignment and the actual alignment. A signal Bin representative of an Input Bias 420 can then be combined with the error signal E to produce a bias compensated signal Eb, which after compensation using a signal "g" representative of Gain 422, can be provided as a signal Eg. Then, signal Eg can then be applied to an I-Vector Generation process 416. The I-Vector Generation process 416 produces an output Ig which can then be applied to a correlation algorithm 418 to produce the correlation feedback (CFB) input. CFB can then be combined with feed forward input and manual input, if any, as an input for adjusting parameters of the Process Function 410.

Figure 5:
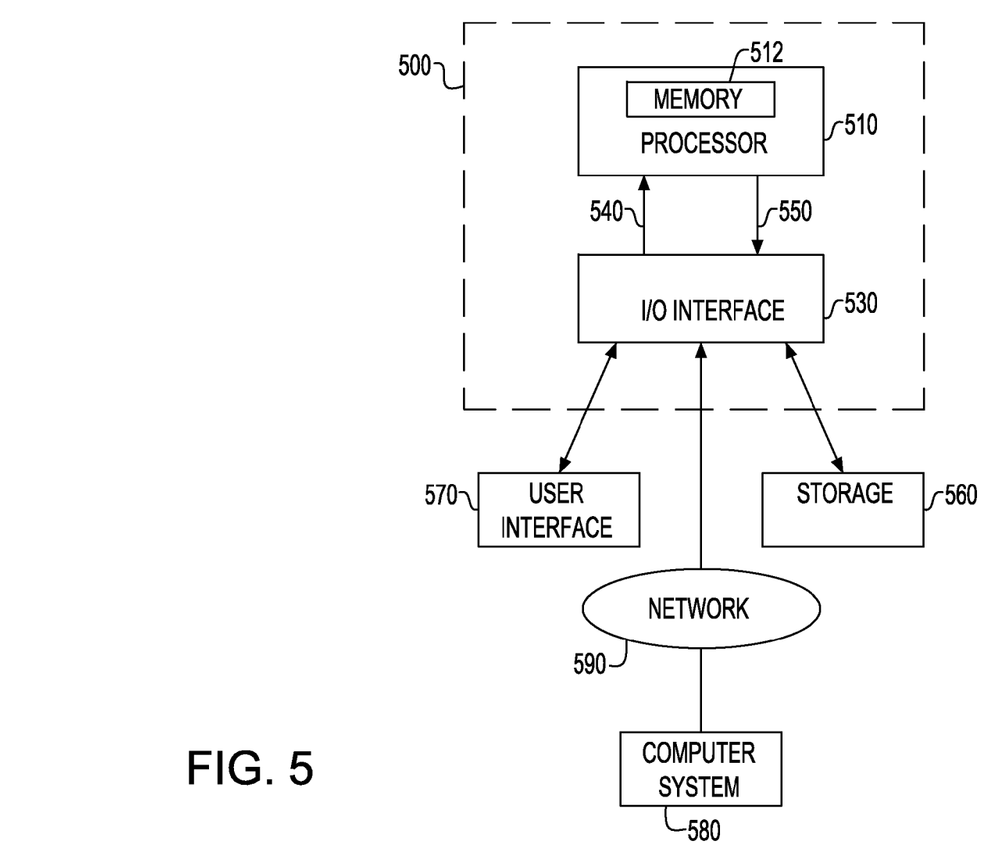
FIG. 5 is a block diagram illustrating a system in accordance with an embodiment herein.

FIG. 5 illustrates an information processing system 500 in accordance with an embodiment of the invention. As shown in FIG. 5, the information processing system can include a first processor 510 provided with a memory 512. The processor 510 may be a single processor or may include a plurality of processors arranged to execute instructions of a program in a parallel or semi-parallel manner. An input output (I/O) and network interface 530 (hereinafter "I/O interface") is provided for inputting a program including instructions and data for performing a method, such as that described above with reference to FIG. 3, to the CPU 510 and for outputting the results of executing a program. The I/O interface 530 may include one or more types of interfaces to removable digital storage media such as a magnetic disk, magneto-optic disk, read/write disc, read only optical disc, digital tape, removable disk drive, and removable solid state memory such as a portable memory card, among others. The processor 510 can retrieve instructions from storage 560, a removable storage medium or a memory of one or more other computers, e.g., computer system 580 or other storage devices of a network through a network adapter, modem or other device of the I/O interface 530. For example, computer-readable instructions can be stored on one or more removable storage media to be provided to the I/O interface 530, from which the processor 510 can retrieve information or instructions for performing a method according to an embodiment of the invention. The processor 510 can receive and load instructions corresponding to at least a portion of the program into memory and execute the instructions relative to the set of data provided to the processor 510. In one particular example, the I/O interface may be able to receive or input information 540 recorded or stored on a printed, embossed or punched medium, such as a set of instructions executable by a processor which are recorded in computer-readable form on paper. In such case, the paper that stores the recorded computer-readable instructions can be a computer-readable storage medium having instructions recorded thereon which can be read and executed by a processor 510 for performing a method in accordance with an embodiment herein. The I/O interface 530 may also include a display or other user interface 570 for outputting information to a user, inputting information from the user or both. The user interface 570 may additionally include one or more other interface devices such as a keyboard, mouse, speaker, joystick, scanner, printer, etc. and the like. To the extent that any of the above described types of removable storage media are inserted or connected to the I/O interface, processor 510 can retrieve instructions from a program stored in such removable storage medium through the I/O interface 530. Alternatively, the processor 510 can access instructions from a program from storage 560 or through a network 590 from another computer system 580.

In one embodiment, the other computer system 580 can be a host computer system for a fabrication control system. The host computer system can collect, store and maintain information identifying the exposure tools and chucks used in forming the earlier patterns and the present resist patterns. The host computer system can also collect, store and maintain alignment control information for use on various photolithography exposure tools used in fabrication. In one embodiment, such host computer system can perform calculations and provide corrected information for aligning a subject wafer in the current exposure tool. Once processor 510 loads a program and the necessary information, the processor can execute a set of instructions of the program relative to the data and output information 550 to the exposure system 100 (FIG. 1) through the I/O interface 530 connected thereto. The information 550 can then be used by the exposure system 100 to control movement of the wafer relative to the translation stage for correctly aligning the wafer with the exposure tool. In such way, a method of providing improved alignment for a photolithographic exposure in accordance with one or more of the above-described methods can be performed.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of providing improved alignment for a photolithographic exposure, comprising:
   a) identifying a first exposure tool and a first chuck used in a reference photolithographic exposure of a first material layer on a substrate including a semiconductor, the first chuck being one of a plurality of chucks usable with the first exposure tool;
   b) identifying a second exposure tool and a second chuck used in a current photolithographic exposure of a second material layer on the substrate;
   c) computing alignment correction information specific to each of the identified first exposure tool, the first chuck, the second exposure tool and the second chuck, wherein obtaining alignment correction information comprises:
      comparing locations of a first set of resist patterns located on the first material layer of the substrate with locations of a second set of resist patterns located on the second material layer of the substrate;
      determining a degree of alignment between the first set of resist patterns and the second set of resist patterns; and
      generating an error signal, wherein the error signal represents the degree of alignment between the first set of resist patterns and the second set of resist patterns;
      combining the error signal with an input bias to produce a bias compensated signal;
      combining the bias compensated signal with a gain signal to create a gain compensated signal; and
   d) using the alignment correction information specific to each of the identified first exposure tool, the first chuck, the second exposure tool and the second chuck, aligning the semiconductor substrate to the second exposure tool and the second chuck, so as to compensate for alignment error between the first and second exposure tools and the first and second chucks; wherein using the alignment correction information comprises:
      using the error signal as an input to produce a correlation feedback input;
      using a plurality of bias signals from optical elements to produce a correlation feed forward input; and
      combining the correlation feedback input with the correlation feed forward input to produce a correlation feed forward feedback input, wherein the correlation feed forward feedback input is input to a process function to adjust at least one of the first and second exposure tool; wherein the second chuck is other than the first chuck and the second exposure tool is other than the first exposure tool, and wherein step (a) identifies a maintenance cycle state of the first chuck, and the alignment correction information is specific to the maintenance cycle state; and
      further comprising measuring alignment of patterns created using the first exposure tool and the first chuck in a material layer of at least one substrate, and obtaining alignment correction information that is specific to the second exposure tool and the second chuck by a process including measuring an alignment of patterns created by the second exposure tool in a second material layer of at least one substrate, wherein the alignment correction information is obtained by performing measurements on at least two different wafers.

2. A method as claimed in claim 1, further comprising analyzing the alignment correction information specific to one or more of the first or second exposure tools or the first or second chucks to determine whether one of more of the first or second exposure tools or the first or second chucks has changed, and if so, re-obtaining alignment correction information specific to one or more of the first or second exposure tools or the first or second chucks.

3. A method for providing improved alignment for a photolithographic exposure, comprising: a processor; and non-transitory memory containing instructions, the instructions being executable by the processor to perform a method, the method including:
   a) identifying a first exposure tool and a first chuck used in a reference photolithographic exposure of a first material layer on a substrate including a semiconductor, the first chuck being one of a plurality of chucks usable with the first exposure tool;
   b) identifying a second exposure tool and a second chuck used in a current photolithographic exposure of a second material layer on the substrate;
   c) computing alignment correction information specific to each of the identified first exposure tool, the first chuck, the second exposure tool and the second chuck, wherein obtaining alignment correction information comprises:
      comparing locations of a first set of resist patterns located on the first material layer of the substrate with locations of a second set of resist patterns located on the second material layer of the substrate;
      determining a degree of alignment between the first set of resist patterns and the second set of resist patterns; and
      generating an error signal, wherein the error signal represents the degree of alignment between the first set of resist patterns and the second set of resist patterns;
      combining the error signal with an input bias to produce a bias compensated signal;
      combining the bias compensated signal with a gain signal to create a gain compensated signal; and
   d) using the alignment correction information specific to each of the identified first exposure tool, the first chuck, the second exposure tool and the second chuck, aligning the semiconductor substrate to the second exposure tool and the second chuck, so as to compensate for alignment error between the first and second exposure tools and the first and second chucks; wherein using the alignment correction information comprises:
      using the error signal as an input to produce a correlation feedback input;
      using a plurality of bias signals from optical elements to produce a correlation feed forward input; and
      combining the correlation feedback input with the correlation feed forward input to produce a correlation feed forward feedback input, wherein the correlation feed forward feedback input is input to a process function to adjust at least one of the first and second exposure tool; wherein the second chuck is other than the first chuck and the second exposure tool is other than the first exposure tool, and wherein step (a) of the method further identifies a maintenance cycle state of the first chuck, and the alignment correction information is specific to the maintenance cycle state, and wherein the method further measuring alignment of patterns created using the first exposure tool and the first chuck in a material layer of at least one substrate, and obtaining alignment correction information that is specific to the second exposure tool and the second chuck by a process including measuring an alignment of patterns created by the second exposure tool in a second material layer of at least one substrate, wherein the alignment correction information is obtained by performing measurements on at least two different wafers.

4. A non-transitory computer-readable medium having instructions recorded thereon, the instructions being executable by a processor to perform a method, the method comprising:

a) identifying a first exposure tool and a first chuck used in a reference photolithographic exposure of a first material layer on a substrate including a semiconductor, the first chuck being one of a plurality of chucks usable with the first exposure tool;

b) identifying a second exposure tool and a second chuck used in a current photolithographic exposure of a second material layer on the substrate;

c) computing alignment correction information specific to each of the identified first exposure tool, the first chuck, the second exposure tool and the second chuck, wherein obtaining alignment correction information comprises:

comparing locations of a first set of resist patterns located on the first material layer of the substrate with locations of a second set of resist patterns located on the second material layer of the substrate;

determining a degree of alignment between the first set of resist patterns and the second set of resist patterns; and generating an error signal, wherein the error signal represents the degree of alignment between the first set of resist patterns and the second set of resist patterns;

combining the error signal with an input bias to produce a bias compensated signal;

combining the bias compensated signal with a gain signal to create a gain compensated signal; and d) using the alignment correction information specific to each of the identified first exposure tool, the first chuck, the second exposure tool and the second chuck, aligning the semiconductor substrate to the second exposure tool and the second chuck, so as to compensate for alignment error between the first and second exposure tools and the first and second chucks; wherein using the alignment correction information comprises:

using the error signal as an input to produce a correlation feedback input;

using a plurality of bias signals from optical elements to produce a correlation feed forward input; and combining the correlation feedback input with the correlation feed forward input to produce a correlation feed forward feedback input, wherein the correlation feed forward feedback input is input to a process function to adjust at least one of the first and second exposure tool; wherein the second chuck is other than the first chuck and the second exposure tool is other than the first exposure tool, and wherein step (a) identifies a maintenance cycle state of the first chuck, and the alignment correction information is specific to the maintenance cycle state; and further comprising measuring alignment of patterns created using the first exposure tool and the first chuck in a material layer of at least one substrate, and obtaining alignment correction information that is specific to the second exposure tool and the second chuck by a process including measuring an alignment of patterns created by the second exposure tool in a second material layer of at least one substrate, wherein the alignment correction information is obtained by performing measurements on at least two different wafers.

* * * * *